(12) United States Patent
Li et al.

(10) Patent No.: US 9,997,629 B2
(45) Date of Patent: *Jun. 12, 2018

(54) FINFET WITH HIGH MOBILITY AND STRAIN CHANNEL

(71) Applicant: Taiwan Semiconductor Manufacturing Company, Ltd., Hsin-Chu (TW)

(72) Inventors: Hou-Ju Li, Hsin-Chu (TW); Kao-Ting Lai, Hsin-Chu (TW); Kuo-Chiang Ting, Hsin-Chu (TW); Chi-Hsi Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/181,139

(22) Filed: Jun. 13, 2016

(65) Prior Publication Data

US 2016/0293762 A1    Oct. 6, 2016

Related U.S. Application Data

(63) Continuation of application No. 13/542,468, filed on Jul. 5, 2012, now Pat. No. 9,368,628.

(51) Int. Cl.
| | |
|---|---|
| *H01L 29/49* | (2006.01) |
| *H01L 29/78* | (2006.01) |
| *H01L 29/08* | (2006.01) |
| *H01L 29/161* | (2006.01) |
| *H01L 29/165* | (2006.01) |
| *H01L 29/167* | (2006.01) |
| *H01L 29/66* | (2006.01) |

(52) U.S. Cl.
CPC ...... *H01L 29/7848* (2013.01); *H01L 29/0847* (2013.01); *H01L 29/161* (2013.01); *H01L 29/165* (2013.01); *H01L 29/167* (2013.01); *H01L 29/66636* (2013.01); *H01L 29/66795* (2013.01); *H01L 29/785* (2013.01); *H01L 29/7851* (2013.01)

(58) Field of Classification Search
CPC ............ H01L 29/0847; H01L 29/7848; H01L 29/161; H01L 29/167; H01L 29/66636
See application file for complete search history.

(56) References Cited

U.S. PATENT DOCUMENTS

| | | | |
|---|---|---|---|
| 7,230,270 B2 | 6/2007 | Chen et al. | |
| 7,241,649 B2 | 7/2007 | Donze et al. | |
| 7,265,418 B2 | 9/2007 | Yun et al. | |
| 7,279,430 B2 | 10/2007 | Chang et al. | |
| 7,314,787 B2 | 1/2008 | Yagishita | |
| 7,399,690 B2 | 7/2008 | Kwon | |
| 7,456,471 B2 | 11/2008 | Anderson et al. | |
| 7,476,578 B1 | 1/2009 | Cheng et al. | |

(Continued)

FOREIGN PATENT DOCUMENTS

| | | |
|---|---|---|
| JP | 2001267413 A | 9/2001 |
| WO | 2009040707 A2 | 4/2009 |

*Primary Examiner* — Michael Shingleton
(74) *Attorney, Agent, or Firm* — Slater Matsil, LLP

(57) ABSTRACT

An integrated circuit device includes a fin having a gate area beneath a gate electrode structure, a source/drain region disposed beyond ends of the fin, and a first conformal layer formed around an embedded portion of the source/drain region. A vertical sidewall of the first conformal layer is oriented parallel to the gate area.

19 Claims, 6 Drawing Sheets

(56) References Cited

U.S. PATENT DOCUMENTS

| | | |
|---|---|---|
| 7,485,536 B2 | 2/2009 | Jin et al. |
| 7,521,766 B2 | 4/2009 | Yoon et al. |
| 7,772,074 B2 | 8/2010 | Ye et al. |
| 8,552,477 B2 | 10/2013 | Zhu |
| 2002/0053714 A1 | 5/2002 | Lam |
| 2004/0256647 A1 | 12/2004 | Lee et al. |
| 2005/0255656 A1 | 11/2005 | Kang et al. |
| 2007/0026615 A1 | 2/2007 | Goktepeli et al. |
| 2007/0122954 A1 | 5/2007 | Liu et al. |
| 2007/0128782 A1 | 6/2007 | Liu et al. |
| 2007/0155142 A1 | 7/2007 | Jin et al. |
| 2007/0235818 A1 | 10/2007 | Anderson et al. |
| 2007/0267676 A1 | 11/2007 | Kim et al. |
| 2008/0265321 A1 | 10/2008 | Yu et al. |
| 2009/0104739 A1 | 4/2009 | Ye et al. |
| 2009/0273034 A1 | 11/2009 | Woon et al. |
| 2011/0147828 A1 | 6/2011 | Murthy et al. |
| 2011/0227161 A1 | 9/2011 | Zhu et al. |
| 2012/0074468 A1 | 3/2012 | Yeh et al. |
| 2012/0187486 A1 | 7/2012 | Goto et al. |
| 2013/0069172 A1 | 3/2013 | Liao et al. |
| 2013/0134525 A1 | 5/2013 | Jin |
| 2013/0234203 A1 | 9/2013 | Tsai et al. |
| 2013/0292781 A1 | 11/2013 | Chen et al. |
| 2014/0252412 A1 | 9/2014 | Tsai et al. |
| 2014/0264636 A1 | 9/2014 | Tsai et al. |
| 2014/0273379 A1 | 9/2014 | Tsai et al. |
| 2014/0319609 A1 | 10/2014 | Merelle et al. |

US 9,997,629 B2

FINFET WITH HIGH MOBILITY AND STRAIN CHANNEL

This application is a continuation application of U.S. patent application Ser. No. 13/542,468, filed Jul. 5, 2012, entitled FinFET with High Mobility and Strain Channel," which application is incorporated herein by reference in its entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate field-effect transistors (MuGFETs) were developed. These devices not only improve areal density, but also improve gate control of the channel.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The concept may also be applied, however, to other integrated circuits and electronic structures including, but not limited to, multiple gate field-effect transistor (MuGFET) devices.

Figure 1:
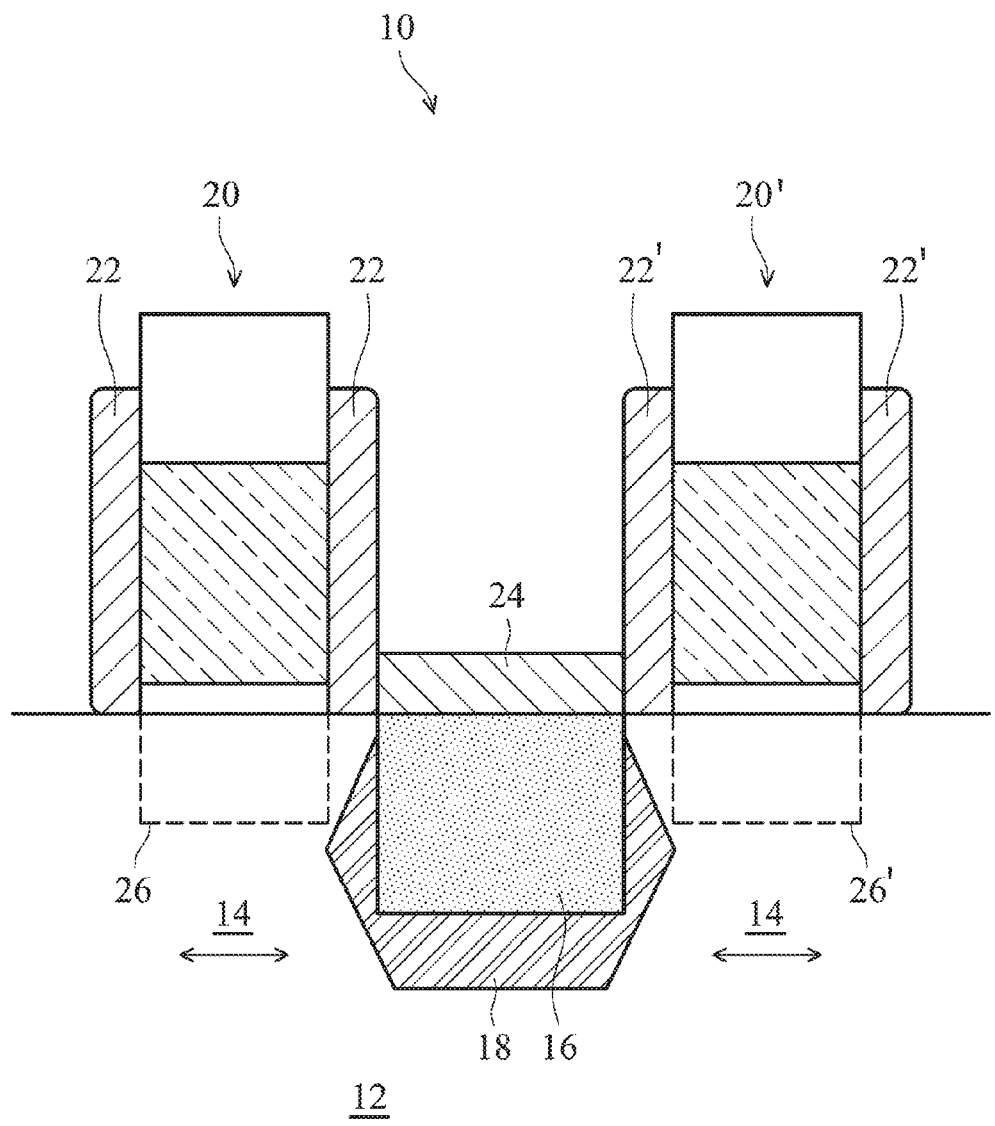
FIG. 1 is a cross section of a representative portion of a conventional FinFET device.

FIG. 1 is a representative portion of a conventional FinFET device 10, which may be referred to as a V-shape tri-layer silicon-germanium (SiGe) device. To provide context, the conventional FinFET device 10 will be briefly described. The FinFET device 10 includes an underlying substrate 12 supporting several fins 14, only one of which is illustrated in FIG. 1 for clarity. The fins 14 generally extend between source/drain regions 16 located proximate opposing ends of the fins 14 (and as shown by the arrows in FIG. 1). For ease of illustration, only a single source/drain region 16 has been depicted in FIG. 1. However, it should be appreciated that a source is formed proximate one end of the fin 14 and a separate and distinct drain is formed proximate the other end of the fin 14. As shown in FIG. 1, the source/drain region 16 is formed from a source/drain material (e.g., boron or phosphorous) embedded in a doped semiconductor layer 18.

Still referring to FIG. 1, a gate electrode structure 20, which is disposed between opposing spacers 22, is stacked above the illustrated fin 14 of the FinFET device 10, and another gate electrode structure 20', which is disposed between other opposing spacers 22'. While not shown for ease of illustration, the gate electrode structure 20 of FIG. 1 may include several discrete layers or components such as, for example, a high-k-dielectric layer, an interfacial oxide layer, a metal gate layer, and a silicide layer. In some circumstances, a metal contact 24 may be formed between opposing gate electrode structures 20 and 20'.

As shown in FIG. 1, a gate area 26 (a.k.a., fin gate area) is disposed beneath each gate electrode structure 20, likewise a gate area 26' is disposed beneath each gate electrode structure 20'. The gate area 26 is illustrated by dashed lines in FIG. 1, as is gate area 26'. As evidenced by FIG. 1, when transitioning from two-dimensional architecture (e.g., a planar transistor) to three-dimensional architecture (e.g., FinFETs, MuGFETs), the profile of the semiconductor layer 18 partially surrounding the source/drain region 16 tends to vary through or along the adjacent gate area 26. It has been discovered that this results in different electrical and strain behavior occurring through the gate area 26. Therefore, the conventional FinFET and MuGFET devices become harder to control and have larger variation from device to device.

Figure 2:
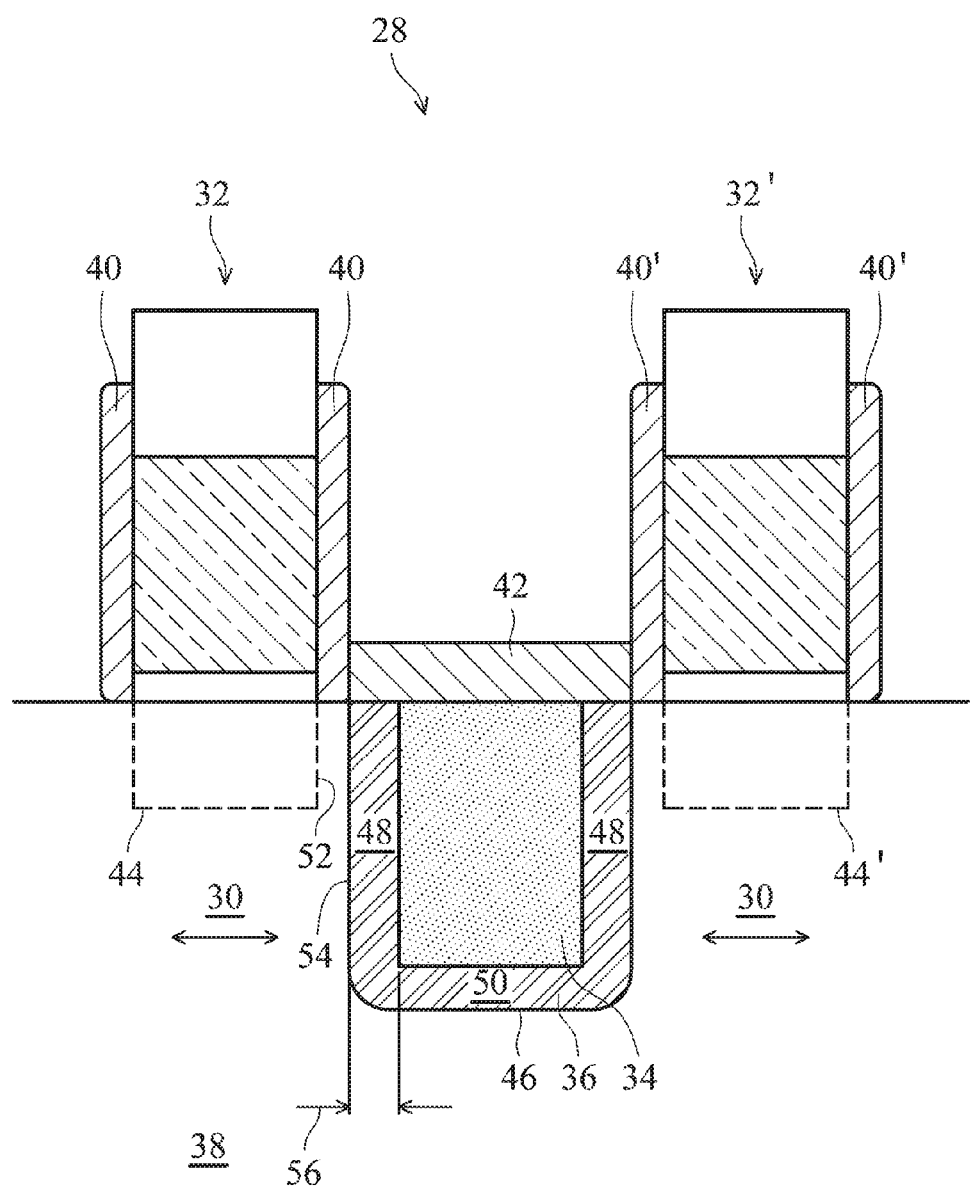
FIG. 2 is a cross section of a representative portion of an embodiment FinFET device having a conformal layer with a sidewall parallel to a gate area of a fin.

Referring now to FIG. 2, an embodiment FinFET device 28 is illustrated. In an embodiment, the FinFET device 28 of FIG. 2 may be referred to as an H-shape tri-layer SiGe device. As will be more fully explained below, the FinFET device 28 provides uniform gate control and strain for three-dimensional transistors. The FinFET device 28 also mitigates or eliminates variation from device to device. As shown in FIG. 2, the FinFET device 10 includes one or more fins 30, only one of which is illustrated for clarity. The FinFET device also includes a gate electrode structure 32 above fin 30, source/drain regions 34, and a first conformal layer 36. Also illustrated in FIG. 2 is another gate electrode structure 32'.

Each fin 30 of the FinFET device 28 is generally supported by an underlying substrate 38, which may be formed from a semiconductor or other suitable material. As shown, each fin 30 is generally disposed beneath one of the gate electrode structures 32. In other words, gate electrode structure 32, which is disposed between opposing spacers 40, is stacked above fin 30 of the FinFET device 28. Also shown are opposing spacers 40' associated with gate electrode structure 32' over fin 30. While not shown for ease of illustration, the gate electrode structures 32 of FIG. 2 may include several discrete layers or components such as, for example, a high-k-dielectric layer, an interfacial oxide layer, a metal gate layer, and a silicide layer. In some circumstances, a metal contact 42 may be formed between opposing gate electrode structures 32 and 32'. A gate area 44, which is generally defined by the gate electrode structure 32, is illustrated in FIG. 2 by dashed lines. Also illustrated is another gate area 44' below gate electrode structure 32'.

Each of the fins 30 generally extends between the source/drain regions 34 located proximate opposing ends of each of the fins 30. In other words, the source/drain regions 34 of the FinFET device 28 are generally disposed beyond ends of the fins 30. For ease of illustration, only a single source/drain region 34 has been depicted in FIG. 2. However, it should be appreciated that a source is formed proximate one end of each fin 30 and a separate and distinct drain is formed proximate the other end of each fin 30. As shown in FIG. 2, the source/drain region 34 is formed from a suitable source/drain material (e.g., boron or phosphorous) embedded in, for example, a first conformal layer 36. In an embodiment, the first conformal layer 36 is a doped or lightly-doped semiconductor material.

The first conformal layer 36 may be formed by, for example, chemical vapor deposition (CVD), atomic layer deposition (ALD), or an epitaxial growth process. The first conformal layer 36 may also be formed by, for example, doping portions of the fin 30 and/or substrate 38 with impurities or by implementing an impurities segregation process. As shown in FIG. 2, the recess 46 occupied by the first conformal layer 36 and the source/drain region 34 may be formed by, for example, dry etch, wet etch, hydrochloric acid (HCl), or an impurities plus etch process.

The first conformal layer 36 is generally formed around an embedded portion of the source/drain region 34. In an embodiment, the first conformal layer 36 is formed over all but a top surface of the source/drain region. Even so, in other embodiments the first conformal layer 36 may be formed over more or less of the source/drain region 34.

Still referring to FIG. 2, the first conformal layer 36 includes vertical sidewalls 48 on either side of, and spaced apart by, a generally horizontal bottom wall 50. As depicted in FIG. 2, the vertical sidewalls 48 are oriented parallel to the adjacent gate area 44. In other words, an exterior surface 52 of each vertical sidewall 48 is parallel to a vertical boundary line 54 of the gate area 44, which is defined by the gate electrode structure 32 located above.

Because the vertical sidewall 48 of the first conformal layer 36 is parallel to the gate area 44 as shown in FIG. 2, the FinFET device 28 generally offers uniform gate control and strain relative to the FinFET device 28 of FIG. 1. Moreover, the first conformal layer 36 mitigates or eliminates undesirable variation from device to device.

In an embodiment, the first conformal layer 36 is able to inhibit dose out-diffusing from the source/drain region. The first conformal layer 36 may also provide either tensile or compressive stress to the gate area 44. In an embodiment, the first conformal layer 36 is lightly-doped silicon and is a lightly doped drain (LDD). In an embodiment, the first conformal layer 36 has a thickness 56 of between about five nanometers (5 nm) and about fifty nanometers (50 nm).

In an embodiment, lightly-doped sidewalls 48 of the FinFET device 28 of FIG. 2 provide enough protection for boron out-diffuse for the lightly doped drain (LDD). In addition, the FinFET device 28 provides a larger SiGe volume and higher strain relative to V-shaped tri-layer and U-shaped tri-layer SiGe devices. Moreover, the FinFET device 28 exhibits less gate oxide damage relative to the V-shaped tri-layer SiGe device.

Figure 3:
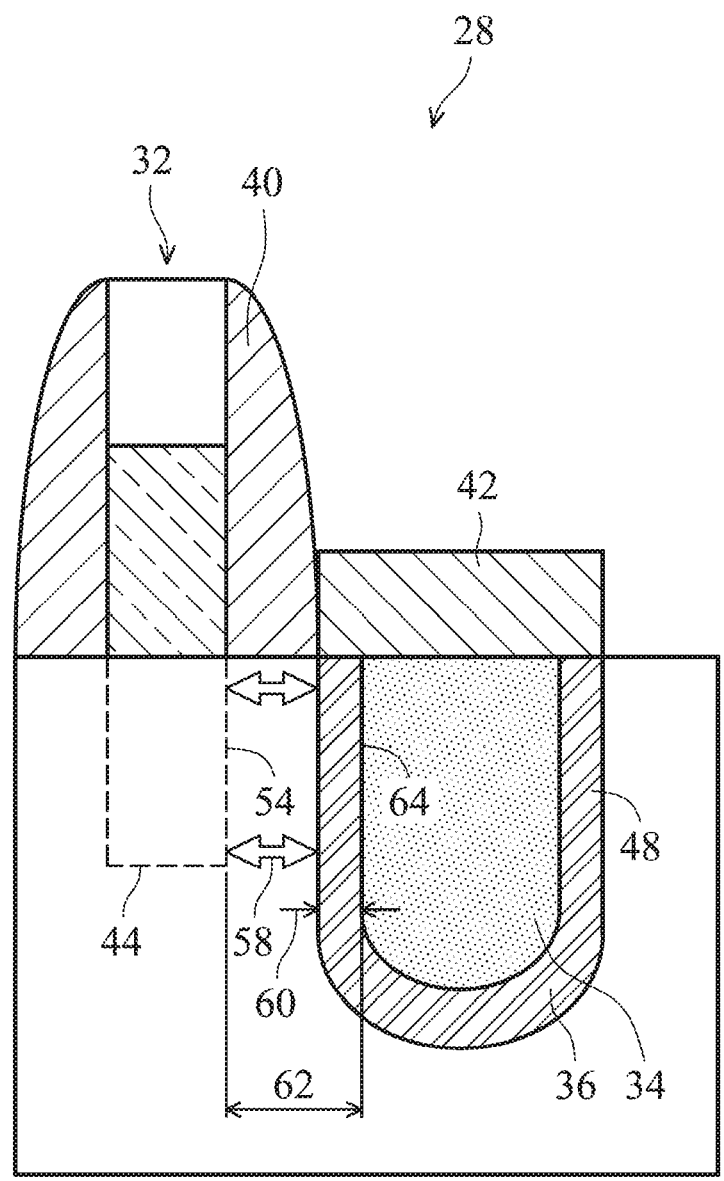
FIG. 3 illustrates an embodiment of the FinFET device of FIG. 2 where the first conformal layer is spaced apart from the gate area by a certain distance.

Referring now to FIG. 3, in an embodiment the first conformal layer 36 is spaced apart from the gate area 44 of the fin 30 by a distance 58 greater than or equal to a thickness 60 of the vertical sidewall 48. In an embodiment, the thickness 60 of the vertical sidewall 48 of the first conformal layer 36 is less than or equal to the distance 62 between the boundary 54 of the gate area 44 and an interface 64 between the first conformal layer 36 and the source/drain region 34.

Figure 4:
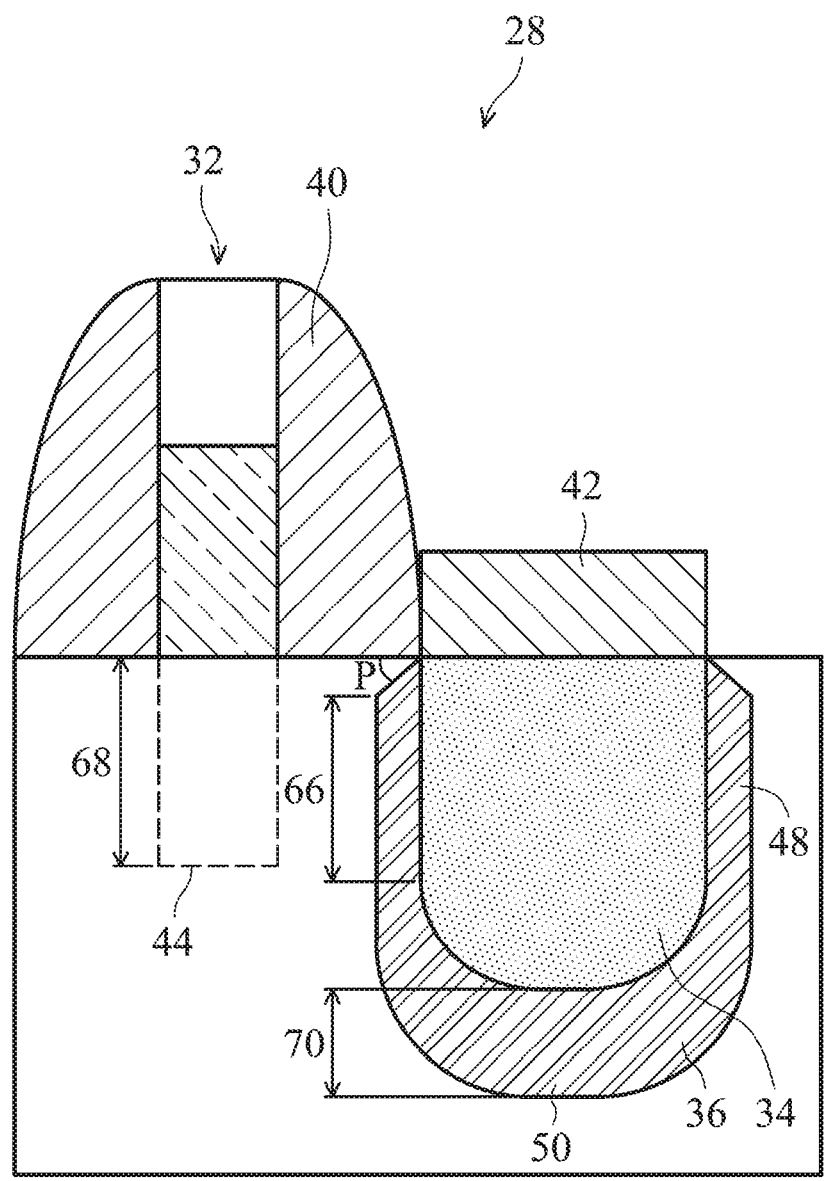
FIG. 4 is illustrates an embodiment of the FinFET device of FIG. 2 having various other dimensions and configurations.

Referring now to FIG. 4, in an embodiment a length 66 of the vertical sidewall 48 of the first conformal layer 36 is greater than or equal to one half of the depth 68 of the gate area 44. As shown in FIG. 4, measurement of the length 66 of the vertical sidewall 48 begins where the vertical sidewall 48 begins having a generally uniform thickness 60. Indeed, in those embodiments where ammonia or other substances are used in forming the recess 46 occupied by the first conformal layer 36 and the source/drain region 34, the upward-facing surface of the vertical sidewall 48 may be angled, as represented by the letter "P" in FIG. 4. In an embodiment, the angle P between the upward-facing surface of the vertical sidewall 48 and the top surface of the fin 30 is seventy degrees or less. As illustrated in FIG. 3, the upward-facing surface of the vertical sidewall 48 may be horizontal. In an embodiment, a thickness 70 of the bottom wall 50 may be greater than the thickness 60 of the vertical sidewall 48.

Figure 5:
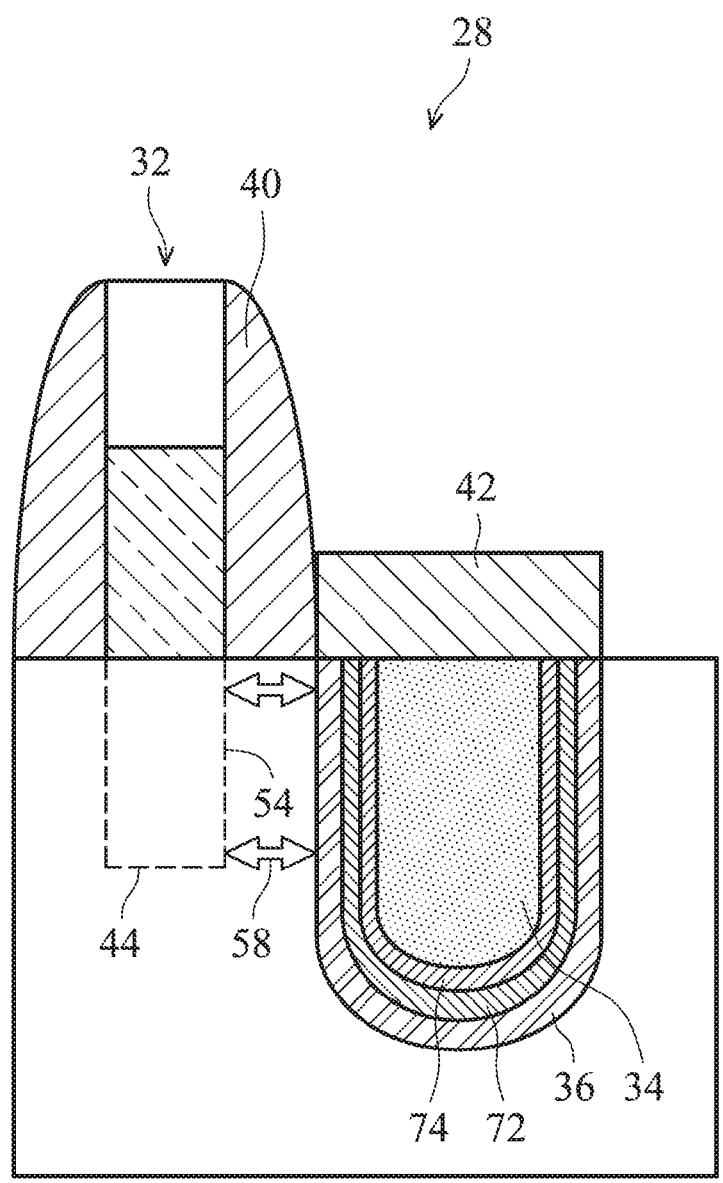
FIG. 5 is a representative portion of an embodiment FinFET device having a plurality of conformal layers.

Referring now to FIG. 5, in an embodiment one or more additional conformal layers are formed. Indeed, a second conformal layer 72 may be formed over the first conformal layer 36. Likewise, a third conformal layer 74 may be formed over the second conformal layer 72. While a total of three conformal layers 36, 72, 74 are depicted in FIG. 5, it should be recognized that more or fewer of the conformal layers may be incorporated into the FinFET device 28.

In an embodiment, the first conformal layer 36 is formed from a different material than one or both of the second and third conformal layers 72, 74. In addition, in an embodiment the first conformal layer 36 may be doped differently or in a different concentration than one or both of the second and third conformal layers 72, 74. As such, a desired gradient doping profile may be generated in the FinFET device 28.

Figure 6:
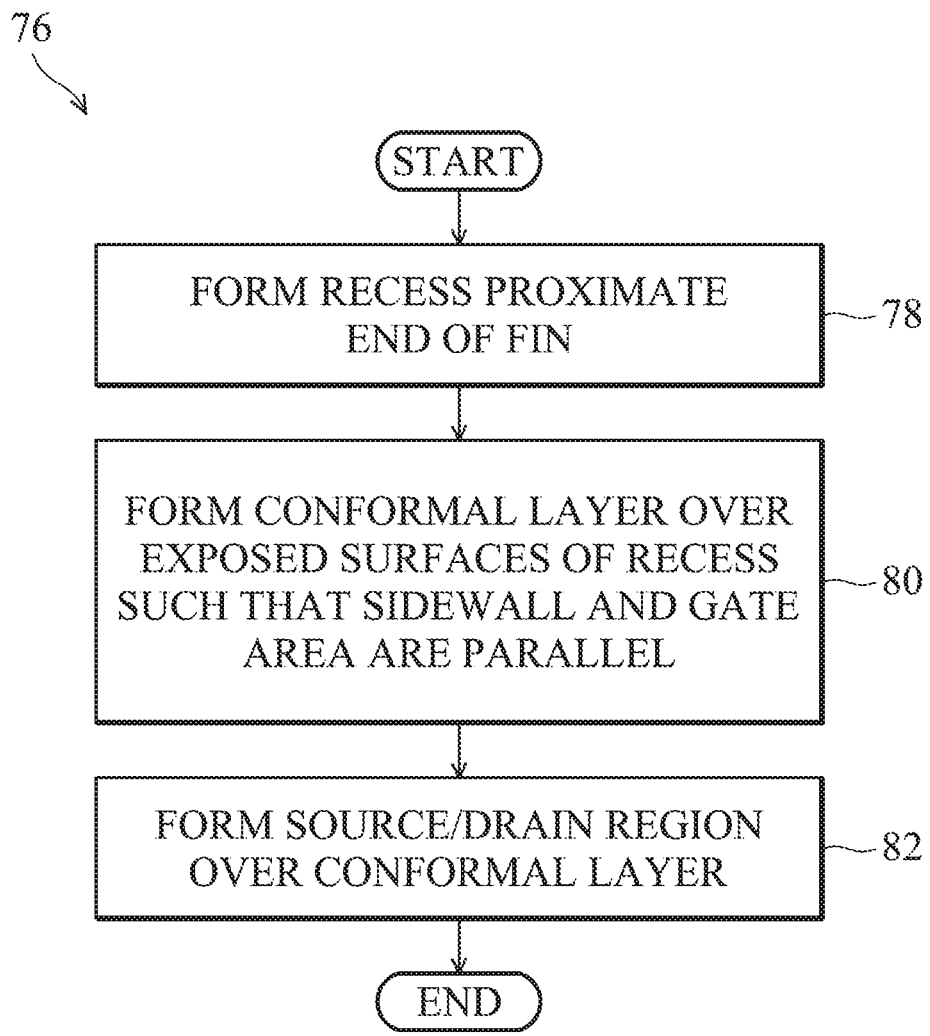
FIG. 6 is an embodiment method of forming the FinFET device of FIG. 2.

Referring now to FIG. 6, a method 76 of forming an integrated circuit device is illustrated. In block 78, a recess is formed proximate an end of the fin 30. As noted above, the gate area of the fin 30 is generally defined by the gate electrode structure 32. In block 80, the first conformal layer 36 is formed over exposed surfaces of the recess 46 such that the vertical sidewall of the first conformal layer 36 is parallel with the gate area 44. In block 82, the source/drain region 34 is formed in the recess over interior surfaces of the first conformal layer 36.

In an embodiment, an integrated circuit device includes a fin having a gate area beneath a gate electrode structure, a source/drain region disposed beyond ends of the fin, and a first conformal layer formed around an embedded portion of the source/drain region, the first conformal layer including a vertical sidewall oriented parallel to the gate area.

In an embodiment, an integrated circuit device includes a fin having a gate area vertically beneath a gate electrode structure, a source/drain region formed beyond ends of the fin and the gate electrode structure, and a first conformal layer formed around an embedded portion of the source/drain region, the first conformal layer including a vertical sidewall with an exterior surface, the exterior surface parallel to a vertical boundary line of the gate area.

In an embodiment, a method of forming an integrated circuit device is provided. The method includes forming a recess proximate an end of a fin, the fin having a gate area beneath a gate electrode structure, forming a first conformal layer over exposed surfaces of the recess, a vertical sidewall of the first conformal layer parallel with the gate area, and forming a source/drain region in the recess over interior surfaces of the first conformal layer.

In an embodiment, an integrated circuit device is provided. The integrated circuit device includes a fin extending in a first direction out from a substrate, the fin having a first end and a second end opposite the first end and a center region interposed between the first end and the second end. The device further includes a gate structure extending over the center region, a recess in the first end of the fin, the recess having substantially straight sidewalls, a first layer lining the substantially straight sidewalls of the recess, the first layer forming a substantially straight interface with a channel region defined under the gate structure, the first layer being conformal along the substantially straight interface, and a source/drain region within the lined recess.

In an embodiment, an integrated circuit device is provided. The integrated circuit device includes a fin extending from a substrate, a gate structure extending over the fin, a source/drain region in a recess in the fin, and a liner separating the source/drain region from the fin, a vertical interface between the source/drain region and the liner being substantially parallel to a sidewall of the gate structure.

In an embodiment, a method of forming the integrated circuit device is provided. The method includes forming a recess proximate a gate area of a fin, the gate area being beneath a gate electrode structure, a vertical boundary of the gate area being defined by a sidewall surface of the gate electrode structure. The method further includes forming a semiconductor layer over all exposed surfaces of the recess, and forming a source/drain region over the semiconductor layer, wherein all surfaces of the source/drain region below an uppermost surface of the fin are in contact with the semiconductor layer, and wherein an interface between the semiconductor layer and the source/drain region is a vertical sidewall parallel with the vertical boundary of the gate area.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit device, comprising:
  a fin extending in a first direction out from a substrate, the fin having a first end and a second end opposite the first end and a center region interposed between the first end and the second end;
  a gate structure extending over the center region;
  a recess in the first end of the fin, the recess having substantially straight sidewalls;
  a first layer lining the substantially straight sidewalls of the recess, the first layer forming a substantially straight interface with a channel region defined under the gate structure, the first layer being conformal along the substantially straight interface; and
  a source/drain region within the lined recess.

2. The integrated circuit device of claim 1, wherein the source/drain region is doped with a dopant, and the first layer reduces out diffusion of the dopant.

3. The integrated circuit device of claim 2, wherein the dopant comprises boron or phosphorous.

4. The integrated circuit device of claim 1, wherein the first layer is configured to provide strain to the center region.

5. The integrated circuit device of claim 1, further comprising one or more second layers interposed between the first layer and the source/drain region.

6. An integrated circuit device comprising:
  a fin extending from a substrate;
  a gate structure extending over the fin;
  a source/drain region in a recess in the fin; and
  a liner separating the source/drain region from the fin, a vertical interface between the source/drain region and the liner being substantially parallel to a sidewall of the gate structure.

7. The integrated circuit device of claim 6, wherein an upper surface of the recess is non-perpendicular relative to an upper surface of the fin.

8. The integrated circuit device of claim 7, wherein an angle between the upper surface of the recess and the upper surface of the fin is less than or equal to seventy degrees.

9. The integrated circuit device of claim 6, wherein the liner is a conformal layer.

10. The integrated circuit device of claim 6, wherein a length of a vertical sidewall of the liner is equal to or greater than one half of a depth of a gate area of the fin below the gate structure.

11. The integrated circuit device of claim 6, wherein the liner comprises a first liner and a second liner interposed between the first liner and the source/drain region, wherein the second liner comprises a different material than the first liner.

12. The integrated circuit device of claim 11, wherein the liner further comprises a third liner interposed between the second liner and the source/drain region.

13. The integrated circuit device of claim 6, wherein the liner exerts a tensile or compressive stress to the fin under the gate structure.

14. The integrated circuit device of claim 6, wherein a first thickness of the liner along a vertical sidewall of the recess is less than a second thickness of the liner along a bottom of the recess.

15. An integrated circuit device, comprising:
  a fin extending in a first direction out from a substrate, the fin having a first end and a second end opposite the first end and a center region interposed between the first end and the second end;
  a gate structure extending over the center region;
  a first recess in the first end of the fin, the first recess having a first substantially straight sidewall;
  a first layer lining the first substantially straight sidewall of the first recess, the first layer forming a substantially straight interface with the fin, the first layer being conformal along the substantially straight interface; and
  a source/drain region within the lined recess.

16. The integrated circuit device of claim 15, wherein the source/drain region is doped with a dopant, and the first layer reduces out diffusion of the dopant.

17. The integrated circuit device of claim 15, wherein the first layer exerts stress a channel region under the gate structure.

18. The integrated circuit device of claim 15, wherein the first layer comprises a lightly doped drain.

19. The integrated circuit device of claim 15, wherein the first layer has a thickness between 5 nm and 50 nm.

\* \* \* \* \*